(12) United States Patent
Uehara et al.

(10) Patent No.: US 9,944,105 B2
(45) Date of Patent: Apr. 17, 2018

(54) IMAGE FORMING METHOD

(71) Applicant: Dai Nippon Printing Co., Ltd., Tokyo (JP)

(72) Inventors: Shun Uehara, Tokyo (JP); Hiroyuki Yamashita, Tokyo (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 0 days.

(21) Appl. No.: 15/353,831

(22) Filed: Nov. 17, 2016

(65) Prior Publication Data

US 2017/0157968 A1 Jun. 8, 2017

(30) Foreign Application Priority Data

Nov. 18, 2015 (JP) .................. 2015-225898

(51) Int. Cl.

| | |
|---|---|
| *B41M 5/382* | (2006.01) |
| *B41M 5/40* | (2006.01) |
| *B41M 5/48* | (2006.01) |
| *H01L 21/56* | (2006.01) |
| *B41M 5/50* | (2006.01) |
| *B41M 5/42* | (2006.01) |
| *B41M 5/44* | (2006.01) |
| *B41M 5/52* | (2006.01) |

(52) U.S. Cl.
CPC .......... *B41M 5/40* (2013.01); *B41M 5/38214* (2013.01); *B41M 5/38228* (2013.01); *B41M 5/38235* (2013.01); *B41M 5/38257* (2013.01); *B41M 5/38278* (2013.01); *B41M 5/42* (2013.01); *B41M 5/44* (2013.01); *B41M 5/48* (2013.01); *B41M 5/506* (2013.01); *B41M 5/5254* (2013.01); *H01L 21/56* (2013.01); *B41M 2205/02* (2013.01); *B41M 2205/32* (2013.01); *B41M 2205/40* (2013.01)

(58) Field of Classification Search
CPC .............. B41M 5/382; B41M 5/38214; B41M 5/38257; B41M 5/40; B41M 5/42; B41M 5/50; B41M 5/502; B41M 5/506; B41M 5/5254; B41M 2205/02; B41M 2205/32; B41M 2205/40
USPC ....................................... 503/227
See application file for complete search history.

(56) References Cited

FOREIGN PATENT DOCUMENTS

| | | |
|---|---|---|
| JP | 2002-006745 A | 1/2002 |
| JP | 2014-046103 A | 3/2014 |

*Primary Examiner* — Bruce H Hess
(74) *Attorney, Agent, or Firm* — Burr & Brown, PLLC (57) ABSTRACT

An image forming method including preparing a thermal transfer sheet having a dye layer on a substrate, the dye layer containing a sublimable dye, preparing a decorative seal having a seal base material on a release sheet, the seal base material having a layered structure of an adhesive layer and a film layered in this order from the release sheet side, the film containing a resin having a dyeing affinity to the sublimable dye contained in the dye layer, and the film having an elongation percentage of not less than 150% and not more than 400% when determined by a test method in conformity with JIS-K-7127:1999, and thermally transferring the sublimable dye in the dye layer onto the seal base material by sublimation thermal transfer process, thereby forming a thermal transfer image on the seal base material.

3 Claims, 2 Drawing Sheets

IMAGE FORMING METHOD

CROSS-REFERENCE TO RELATED APPLICATIONS

This application is based on and claims priority to Japanese Patent Application No. 2015-225898, filed on Nov. 18, 2015, which is hereby incorporated by reference as if set forth in its entirety herein.

STATEMENT REGARDING PRIOR DISCLOSERS BY THE INVENTOR OR A JOINT INVENTOR UNDER 37 C.F.R. 1.77(B) (6)

An image forming method according to the present invention and decorative sheets using the image forming method were disclosed and sold on Sep. 10, 2015, by Dai Nippon Printing Co. Ltd., to a third-party company, SEGA Interactive Co., Ltd. Dai Nippon Printing Co. Ltd. obtained the image forming method and the decorative seals from the present inventors, Shun Uehara and Hiroyuki Yamashita who, during the course of their employment, developed the image forming method and the decorative sheet that their employer began selling on Sep. 10, 2015.

TECHNICAL FIELD

The present invention relates to an image forming method, specifically, the present invention relates to an image forming method using a decorative seal.

BACKGROUND ART

Conventionally, for the sake of decorating a transfer image-receiving article (imparting a design property to the transfer image-receiving article), some attempts have been made, where a decorative seal having a seal base material and an thermally transferred image formed on the seal base material is used, and the seal base material provided with the thermally transferred image thus formed is stuck on the transfer image-receiving article. As the decorative seal, for example, a product where an adhesive layer, and a base material layer on which a thermally transferred image is formed (the base material layer is also referred to as "decorative layer" or the like, in some cases.) are layered in this order on a release sheet (the release sheet is also referred to as "peel-off sheet", "releasing material", or the like), the thus layered adhesive layer and the base material layer constituting a seal base material, has been proposed. When using the product, the seal base material is peeled off from the release sheet, then the adhesive layer is applied on the transfer image-receiving article, and thereby, the seal base material is allowed to be stuck on the transfer image-receiving article.

As the transfer image-receiving article to which the seal base material is affixed, for instance, the ones that have an individual curved surface, such as, human body, beverage containers, etc, are considered, in addition to the others that have an individual flat surface, such as a card, etc. For example, Patent Literature 1 has proposed a decorative seal for decorating an transfer image-receiving article that has a flat surface as the surface to which the seal base material is affixed, such as a message card, etc., while Patent Literature 2 has proposed another decorative seal for decorating an transfer image-receiving article that has a curvature, such as a nail, etc.

In order to sufficiently enhance the decorativeness of the transfer image-receiving material, it is necessary to stick the seal base material, on which the thermal transfer image has been formed, on the transfer image-receiving material without causing crinkle or the like. However, when using a material having a curvature as the transfer image-receiving material, it is difficult to stick the seal base material on the transfer image-receiving material without crinkle, and there is a room for improvement in this point with respect to the decorative seal which has been proposed up to now.

Recently, it has been widely practiced to form a thermal transfer image by using a sublimation type thermal transfer system that is excellent in halftone reproducibility and gradation, and that can clearly develop a full color image as the original. In forming a thermal transfer image on the decorative seal, it is important that the preservability of the formed thermal transfer image is high, in other words, it is important that the formed thermal transfer image does not fade or is difficult to discolor. Under the current circumstances, however, these aspects have not been studied enough.

PRIOR ART DOCUMENTS

Patent Literature

Patent Literature 1: JP 2002-6745 A
Patent Literature 2: JP 2014-46103 A

SUMMARY OF THE INVENTION

Disclosure of the Invention

The present invention has been accomplished in view of this situation, a main object of the present invention is to provide an image forming method capable of suppressing discoloration of a thermal transfer image formed when a thermal transfer image is formed on a decorative seal.

SUMMARY OF THE INVENTION

The present invention for solving the above problems relates to an image forming method which is characterized by using a decorative seal which comprises a seal base material provided on a release sheet and a thermal transfer sheet which comprises a dye layer formed on a substrate; including a step where a sublimable dye contained in the dye layer of the thermal transfer sheet is brought into transfer onto the seal base material of the decorative seal by a sublimation type thermal transfer process, and thereby a thermal transfer image is formed on the seal base material; wherein the seal base material of the decorative seal used for forming the thermal transfer image is provided so as to be releasable from the release sheet and the seal base material shows a layered structure in which an adhesive layer and a film are layered in this order from the release sheet side; and wherein the film constituting the seal base material contains a resin having a dyeing affinity to the sublimable dye contained in the dye layer, and the film has an elongation percentage of being in the range of not less than 150% and not more than 400% when determined by a test method in conformity with JIS-K-7127:1999.

In addition, the film may contain a vinyl chloride resin as the resin having the dyeing affinity to the sublimable dye.

The thickness of the film may be in the range of not less than 20 μm and not more than 60 μm.

Effect of the Invention

According to the image forming method of the present invention, it is possible to form a clear thermally transferred image on the decorative seal by using the sublimation thermal transfer process.

DETAILED DESCRIPTION OF THE INVENTION

<<Image Forming Method>>

Figure 1:
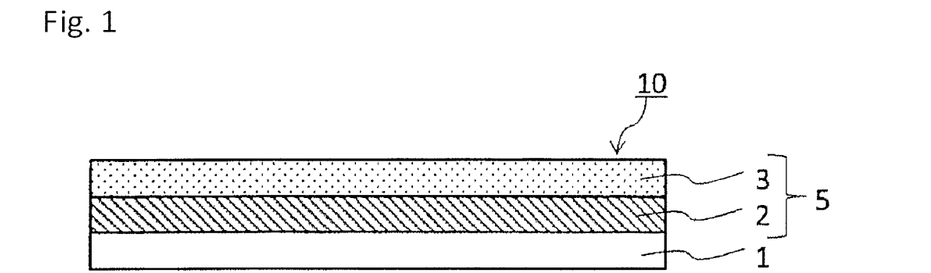
FIG. 1 is a schematic sectional view showing an example of a decorative seal used in an embodiment of the image forming method according to the present invention.
Figure 2:
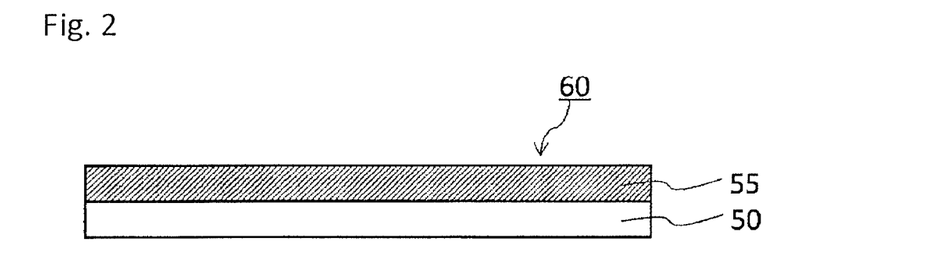
FIG. 2 is a schematic sectional view showing an example of a thermal transfer sheet used in an embodiment of the image forming method according to the present invention.
Figure 3A:
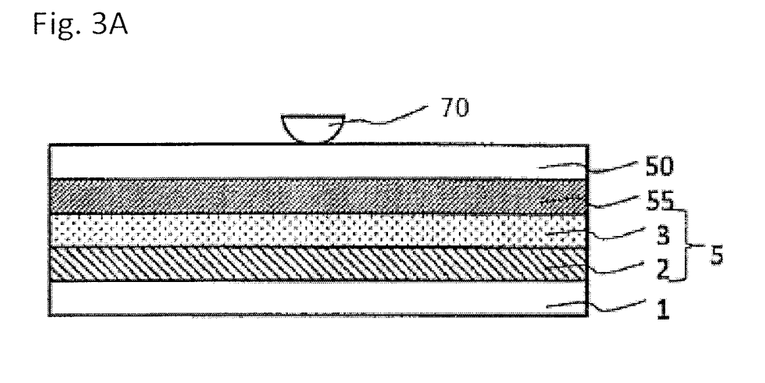
FIG. 3 are schematic sectional views showing an example of a decorative seal on which a thermal transfer image is formed by an embodiment of the image forming method according to the present invention.
Figure 3B:
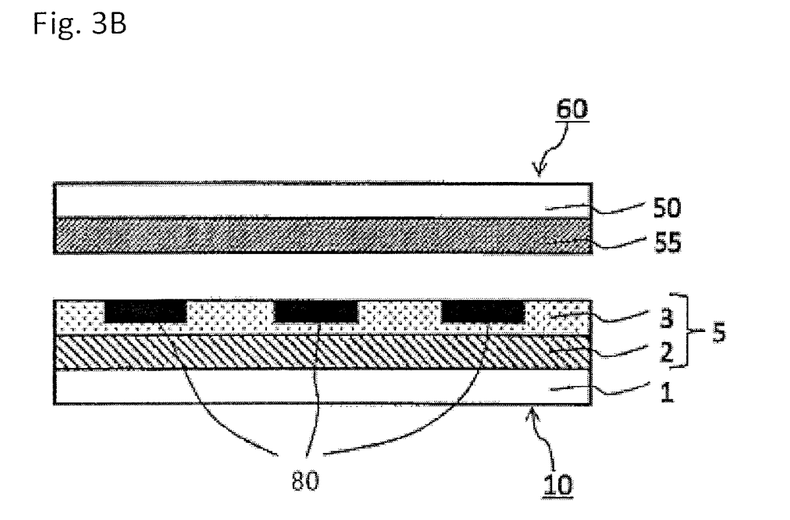

Now, an image forming method according to an embodiment of the present invention (hereinafter, it is referred to as an "image forming method of one embodiment") will be described. The image forming method of one embodiment is characterized by using a decorative seal 10 which comprises a seal base material 5 provided on a release sheet 1, as shown in FIG. 1, and a thermal transfer sheet 60 which comprises a dye layer 55 formed on a substrate 50, as shown in FIG. 2; including a step where a sublimable dye contained in the dye layer 55 of the thermal transfer sheet 60 is brought into transfer onto the seal base material 5 of the decorative seal 10 by a sublimation type thermal transfer process, as shown in FIGS. 3A and 3B, and thereby a thermal transfer image is formed on the seal base material 5; wherein the seal base material 5 of the decorative seal 10 used for forming the thermal transfer image is provided so as to be releasable from the release sheet 1 and the seal base material 5 shows a layered structure in which an adhesive layer 2 and a film 3 are layered in this order from the release sheet 1 side; and wherein the film 3 constituting the seal base material 5 contains a resin having a dyeing affinity to the sublimable dye contained in the dye layer 55, and the film 3 has an elongation percentage of being in the range of not less than 150% and not more than 400% when determined by a test method in conformity with JIS-K-7127:1999.

Herein, JIS-K-7127: 1999 is a standard titled "Plastics—Determination of tensile properties—Part 3: Test conditions for films and sheets", corresponding to ISO 527-3: 1995. The content of JIS-K-7127: 1999 and ISO 527-3: 1995 are incorporated here by reference in their entirety.

According to the image forming method of one embodiment having this feature, it is possible to prevent the thermal transfer image formed on the decorative seal from discoloring, and it is also possible to improve the wearing property when the seal base material 5 including the film 3 to which the thermal transfer image is formed is affixed onto the transfer image-receiving article. Then, the decorative seal 10 and the thermal transfer sheet 60 which are used in the image forming method of one embodiment will be described concretely.

(Decorative Seal)

As shown in FIG. 1, the decorative seal 10 used in the image forming method of one embodiment has a configuration in which the seal base material 5 is provided on the release sheet 1 so as to be peelable from the release sheet. As shown in this figure, the seal base material 5 has a layered structure in which the adhesive layer 2 and the film 3 are layered in this order from the release sheet 1 side. Each component of the decorative seal 10 will be described below.

(Release Sheet)

The release sheet 1 is provided in order to prevent the adhesive layer 2 of the seal base material 5 from adhering to a certain other object until the seal base material 5 is affixed onto the transfer image-receiving article, and to prevent occurrence of the blocking when the decorative seal 10 is wound up.

The release sheet 1 is composed of a substrate for a release sheet for supporting the seal base material 5, and optionally, a releasing layer provided as necessary. That is, the release sheet substrate and the releasing layer provided as necessary constitute the release sheet 1.

As the substrate for the release sheet, single-layered or multi-layered film or sheet of one or more of synthetic resins, for instance, polyester resins such as polyethylene terephthalate, polybutylene terephthalate, polyethylene terephthalate-isophthalate copolymer, etc.; polyolefinic resins such as polyethylene, polypropylene, polymethyl pentene, etc.; polyvinyl fluoride, polyvinylidene fluoride, polyethylenic fluoride resins such as polytetrafluoroethylene, ethylene-tetrafluoroethylene copolymer, etc.; polyamide type resins such as nylon 6, nylon 6,6, etc.; vinylic resins such as polyvinyl chloride, vinyl chloride-vinyl acetate copolymer, ethylene-vinyl acetate copolymer, ethylene-vinyl alcohol copolymer, polyvinyl alcohol, vinylon, etc.; cellulose type resins such as cellulose triacetate, cellophane, etc.; acrylic resins such as polymethyl methacrylate, polyethyl methacrylate, polyethyl acrylate, polybutyl acrylate, etc.; polystyrenes; polycarbonates; polyarylates, polyimides, and the like, may be enumerated.

Further, the releasing layer arbitrarily provided on the substrate for the release sheet contains a binder resin and a releasing agent. As the releasing agent, for instance, fluorine resins, waxes such as paraffin waxes, montan waxes, synthetic waxes, etc., may be enumerated. As the binder resin, for instance, acrylic resins, cellulose type resins, vinylic resins, etc., may be enumerated.

Further, a release agent may be contained in the release sheet substrate without providing a releasing layer. Note that the decorative seal 10 used in the image forming method of one embodiment is characterized by the seal base material 5 that includes the adhesive layer 2 and the film 3. Therefore, as the release sheet 1, any of conventionally known releasing sheets can be used.

The thickness of the release sheet 1 is not particularly limited, but it is preferably to be in the range of not less than 50 μm and not more than 200 μm. Further, for the purpose of improving the adhesion property between the release sheet 1 and an adhesive layer 2 described later, the surface of the release sheet 1 may be subjected to adhesiveness improving treatment(s), such as, corona discharge treatment, plasma treatment, primer coating, degreasing treatment, surface roughening treatment or the like.

(Seal Base Material)

As shown in FIG. 1, a seal base material 5 is provided on the release sheet 1. The seal base material 5 is provided so as to be peelable from the release sheet 1, and shows a layered structure in which the adhesive layer 2 and the film 3 are laminated in this order from the release sheet 1 side. Note that the decorative seal 10 used in the image forming method of one embodiment can decorate a transfer image-receiving article by a procedure such that after a thermal transfer image is formed on the film 3 of the decorative seal 10, the base material 5 including the film 3 on which the thermal transfer image has been formed is peeled off from the release sheet 1, and then the adhesive layer 2 of the seal base material 5 is brought into contact with the transfer image-receiving article. The seal base material 5 may include any arbitrary layer(s) provided between the adhesive layer 2 and the film 3 and/or on the film 3.

(Adhesive Layer)

There is no particular limitation on the adhesive layer 2 constituting the seal base material 5, and any of conventionally known solvent type or aqueous type adhesive agents can be used. As the adhesive agent, for instance, vinyl acetate resins, acrylic resins, vinyl acetate-acrylic copolymers, vinyl acetate-vinyl chloride copolymers, ethylene-vinyl acetate copolymers, ethylene-acrylic acid copolymers, ethylene-acrylic acid ester copolymers, polyurethane resins, natural rubbers, chloroprene rubbers, nitrile rubbers and the like, may be enumerated. The adhesive layer 2 may contain one of these resins singly or may contain two or more kinds thereof.

The thickness of the adhesive layer 2 is not particularly limited, but it is preferably 1 to be in the range of not less than 1 μm and not more than 100 μm. There is also no particular limitation on the method of forming the adhesive layer 2, and for instance, it can be formed by preparing a coating liquid where an adhesive agent and any additive agent(s) optionally added as necessary are dispersed or dissolved in an appropriate solvent, and coating the coating liquid on the release sheet 1 and drying the coated coating liquid.

(Film)

On the adhesive layer 2, the film 3 constituting the seal base material 5 is provided. In an aspect, the decorative seal used in the image forming method of one embodiment is characterized in that the film 3 contains a resin having a dyeing affinity to the sublimable dye, and the film 3 has an elongation percentage of being in the range of not less than 150% and not more than 400% when determined by a test method in conformity with JIS-K-7127:1999.

According to the image forming method of one embodiment having this feature, when the elongation percentage of the film 3 of the decorative seal 10 used for forming a thermal transfer image is defined within the range of being not less than 150% and not more than 400%, it is possible to prevent the thermally transferred image formed on the film 3 from discoloration. In other words, the preservability of the formed thermal transfer image can be improved. Furthermore, it is possible to suppress occurrence of crinkle upon affixing the seal base material 5 onto the transfer image-receiving material, wherein the seal base material 5 includes the film 3 on which the thermal transfer image has been formed. In particular, even when the surface of the transfer image-receiving article to which the transferred image is affixed has a curvature, occurrence of crinkle can be suppressed upon affixing the seal base material 5 onto the transfer image-receiving article. In other words, it is possible to improve the mountability of the seal base material 5 when the seal base material 5 is affixed onto the transfer image-receiving article.

Here, the "sublimation type thermal transfer process" referred to in the present specification is the process where a thermal transfer sheet provided with a dye layer containing a sublimable dye is used, and an energy is applied to the back side of the thermal transfer sheet, and thereby, the sublimable dye contained in the dye layer is allowed to transfer onto the film 3 to form a thermal transfer image.

In addition, the determination of the elongation percentage in conformity with JIS-K-7127:1999 was performed by using a tensile tester, pulling a test piece at a speed of 200 mm/min until the piece was mutilated, and calculating the elongation percentage when the test piece was mutilated (ruptured) in accordance with the following equation (1).

$$\text{Elongation percentage } (\%) = 100 \times (L - L_0) \tag{1}$$

(wherein, L is the length of the test piece at mutilation, and $L_0$ is the length of the test piece before undergoing the test)

As the tensile testing machine, for example, a TENSILON universal material testing machine or the like can be used.

In the image forming method of one embodiment, it is an essential condition that the film 3 of the decorative seal 10 to be used for forming a thermally transferred image has an elongation percentage of being in the range of not less than 150% and not more than 400% or less determined by the test method in conformity with JIS-K-7127:1999. This is because, if the elongation percentage of the film is less than 150%, it becomes impossible to affix the seal base material, including the film 3 on which an image has been formed, without generating any crinkle, onto a thermal transfer-image receiving article the surface of which has a curvature.

By the way, in the case where the main objective is merely to affix the seal base material 5 on the thermal transfer-image receiving article having a curvature without causing crinkle, it is only required to satisfy the condition that the elongation percentage of the film 3 is not less than 150%. However, as described above, the film 3 contains a resin having the dyeing affinity to the sublimable dye, and thus the file 3 can form a thermal transfer image by the sublimation type thermal transfer process.

The elongation percentage of the film 3 has close relationships with the mountability when the seal base material 5 is affixed on the transfer image-receiving article and the discoloring or fading property (sometimes it is referred to as preservability) of the thermally transferred image formed on the film 3. When the elongation percentage of the film is increased with a focus on mountability as the main concern, smearing of the thermal transfer image formed on the film 3 will occur, and the thermal transfer image formed tends to be discolored. In other words, it can be said that there is a trade-off relationship between the mountability of the film 3 and the fading property of the thermal transfer image to be formed. Here, the fading of the thermally transferred image is presumably due to the fact that the sublimable dye easily diffuses in the film 3 as the elongation percentage of the film 3 increases.

Considering this point, the decorative seal 10 used in the image forming method of one embodiment has a further condition that the upper limit of the elongation percentage of the film 3 determined by the test method in conformity with JIS-K-7127:1999 is 400%. According to the decorative seal 10 used in the image forming method of one embodiment in which the upper limit value of the elongation percentage of the film 3 is set to 400%, as described above, while the wearing property of the seal base material 5 is made favorable, it is possible to suppress the diffusion of the sublimable dye in the film 3, and to suppress the discoloration of the thermal transfer image formed. That is, a clear thermal transfer image can be formed on the film 3.

Incidentally, the improvement of the mountability of the decorative seal 10 used in the image forming method of one embodiment is achieved by setting the elongation percentage of the film 3 determined by the test method in conformity with JIS-K-7127: 1999 to 150% or more. Even when the elongation percentage of the entire seal base material 5 determined by the test method in conformity with JIS-K-7127: 1999 is 150% or more, the mountability of the seal base material 5 cannot be sufficiently satisfied unless the elongation percentage of the film 3 determined by the test method in conformity with JIS-K-7127: 1999 is 150% or more.

As described above, by satisfying the condition that the elongation percentage of the film 3 which is determined by the test method in conformity with JIS-K-7127: 1999 is in the range of not less than 150% and not more than 400%, it is possible to improve the mountability of the seal base material 5, and to suppress fading in a thermally transferred image formed on the film 3 by the sublimation type thermal transfer process. In the case of seeking a further improvement on the mountability and/or suppression of the discoloration, it is more preferable that the elongation percentage of the film 3 which is determined by the test method in conformity with JIS-K-7127: 1999 is in the range of not less than 150% and not more than 300%, and it is particularly preferable that it is in the range of not less than 200% and not more than 300%.

There is no particular limitation on the resin having a dyeing affinity to the sublimable dye contained in the film 3, and, for instance, polyolefin resins such as polypropylene, etc.; halogenated resins such as polyvinyl chloride, polyvinylidene chloride, etc.; vinylic resins such as polyvinyl acetate, vinyl chloride-vinyl acetate copolymer, ethylene-vinyl acetate copolymer, polyacrylic acid ester, etc.; polyester resins such as polyethylene terephthalate, polybutylene terephthalate, etc.; polystyrene type resins; polyamide type resins; copolymers of olefin, such as ethylene or propylene, and other vinyl monomer; ionomer resins; cellulose type resin such as cellulose diastase; polycarbonates; acrylic resins, and the like may be enumerated. The film 3 may contain one type of resins alone, or may contain two or more kinds thereof, as the resin having a dyeing affinity to the sublimable dye. In addition to the resin having the dyeing affinity to the sublimable dye, a resin not having the dyeing affinity to the sublimable dye may be also contained.

Among these, the film 3 preferably contains a polyvinyl chloride resin, a polyester resin, an acrylic resin, and/or a cellulose resin as the resin having the dyeing affinity to the sublimable dye, and particularly preferably contains a polyvinyl chloride resin. Among resins having the dyeing affinity to the sublimable dye, polyvinyl chloride resins have high dyeing affinity, and by a synergistic effect of this high dyeing affinity and the elongation percentage of the film being in the range of not less than 150% and not more than 400%, it is possible to more effectively prevent the color fading of the thermal transfer image which is formed on the film 3 by the sublimation type thermal transfer process.

Further, according to the film 3 containing a polyvinyl chloride resin and having an elongation percentage within the range of not less than 150% and not more than 400%, even when the thickness of the film 3 is increased, it is possible to suppress the fading of the thermally transferred image. In general, when the thickness of the layer containing the resin having the dyeing affinity to the sublimable dye is increased, in the layer containing the resin having the dyeing affinity to the sublimable dye, the sublimable dye transferred in the layer is diffused and settled, and the fading such as smearing is liable to occur in the formed thermal transfer image. Therefore, it can be said that the film 3 containing a polyvinyl chloride resin and having an elongation percentage within the range of not less than 150% and not more than 400% is preferable in the case that the thickness of the film 3 is increased in order to impart bounce and the like property of the seal base material 5.

In addition, the film 3 may contain a plasticizer for adjusting the elongation percentage of the film 3 within the above range, together with the resin having the dyeing property to the sublimable dye. By including the plasticizer in the film 3, it is possible to easily adjust the elongation percentage of the film 3 within the range of not less than 150% and not more than 400%.

As the plasticizer, for instance, phthalic acid type plasticizers such as dioctyl phthalate, diisononyl phthalate, octyldecyl phthalate, diisodecyl phthalate, etc.; adipic acid type plasticizers such as di-2-ethylhexyl adipate, diisononyl adipate, diisodecyl adipate, etc.; di-2-ethylhexyl azelate, di-2-ethylhexyl sebacate, tricresyl phosphate, tricresyl phosphate, tributyl phosphate, tri-2-ethylhexyl phosphate, octyl diphenyl phosphate, chlorinated paraffins, chlorinated fatty acid esters, epoxidized soybean oils and the like may be enumerated. The film 3 may contain one type of plasticizer or two or more types of plasticizers.

The content of the plasticizer is not particularly limited, and it may be appropriately set according to the type of the resin having dyeing affinity to the sublimable dye to be contained in the film 3.

By positioning the film 3 on the outermost surface of the decorative seal 10 used in the image forming method of one embodiment, it is possible to form a thermal transfer image on the surface of the seal base material 5 by the sublimation type thermal transfer process, without providing any other layer for receiving the sublimable dye, for instance, an additional receiving layer. In other words, according to the decorative seal 10 used in the image forming method of one embodiment, it is not particularly necessary to provide another layer on the film 3, and by positioning the film 3 on the outermost surface, it is possible to achieve a reduction in the cost of production.

The thickness of the film 3 is not particularly limited, but when the film 3 is positioned on the outermost surface of the decorative seal 10, the thickness of the film 3 is preferably to be in the range of not less than 10 μm and not more than 100 μm, more preferably to be in the range of not less than 20 μm and not more than 60 μm. By setting the thickness of the film 3 within the above-mentioned preferable range, it is possible to further improve the storability of the decorative image and the wearability of the decorative image.

The film 3 may contain additives such as a stabilizer, titanium oxide, silica, etc., in addition to the resins exemplified above, and the plasticizer optionally added as necessary.

There is no particular limitation on the method of forming the film 3, and it is possible to prepare the film 3 by mixing the resin exemplified above, the plasticizer optionally added as necessary, and the optional additives at an arbitrary ratio and thermally processing the mixed composition so as to attain an elongation percentage of the formed film 3 to be in the range of not less than 150% and not more than 400% the film 3. Instead of such a thermal processing, the film 3 can be also formed by preparing a coating liquid where the resins exemplified above, plasticizers optionally added as needed, and optional additives are dispersed or dissolved in an appropriate solvent, coating the coating liquid onto the adhesive layer 2 or an arbitrary layer provided on the adhesive layer 2, and drying the coated coating liquid.

The decorative seal 10 used in the image forming method of one embodiment may be provided with any arbitrary layer(s) located between the adhesive layer 2 and the film 3 and/or on the film 3 in order to improve the decorativeness of the seal base material 5, or to impart a prescribed function to the seal base material. As the layer provided between the adhesive layer 2 and the film 3, for instance, a hologram layer or the like may be enumerated. As the arbitrary hologram layer, for example, a layer having a concavo-convex pattern (interference fringe) or a sheet having a hologram as commercially available may be used, and further the one that is colored in a golden color, a silver color or the like by metal deposition or the like on the hologram may be enumerated.

Since the elongation percentage of the film in the decorative seal 10 used in the image forming method of one embodiment is 150% or more, it is difficult in a sense to form the an optional layer by applying and drying a coating liquid on the film 3. Depending on the elongation percentage of the arbitrary layer provided on the film 3, the crinkle may arise in the arbitrary layer when the seal base material 5 is affixed onto the transfer image-receiving article, and thus the design property of the transfer image-receiving material to which the seal base material 5 has been attached may be deteriorated. The decorative seal 10 used in the image forming method of one embodiment does not exclude that an arbitrary layer is provided on the film 3 as a layer constituting the seal base material 5, but as described above, it is preferable that the film 3 is located on the outermost surface of the decorative seal 10.

(Thermal Transfer Sheet)

As shown in FIG. 2, the thermal transfer sheet 60 used in the image forming method of one embodiment has a configuration in which a dye layer 55 is provided on one side of a substrate 50, and the dye layer 55 contains a sublimable dye. Each component of the thermal transfer sheet 60 will be described below.

(Substrate)

The substrate 50 may be any conventionally known one as long as it has a certain level of heat resistance and strength, and, for instance, resin films such as polyethylene terephthalate film, 1,4-polycyclohexylenedimethylene terephthalate film, polyethylene naphthalate film, polyphenylene sulfide film, polystyrene film, polypropylene film, polysulfone film, aramid film, polycarbonate film, polyvinyl alcohol film, cellulose derivative such as cellophane or cellulose acetate, polyethylene film, polyvinyl chloride film, nylon film, polyimide film, ionomer resin film, etc.; papers such as condenser paper, paraffin paper, synthetic paper, etc.; nonwoven fabric; composites of paper or nonwoven fabric with a resin; and the like may be enumerated.

Although the thickness of the substrate 50 is not particularly limited, it is usually in the range of not less than 0.5 μm and not more than 50 μm, preferably in the range of not less than approximately 1.5 μm and not more than 10 μm.

The substrate 50 may be subjected to a surface treatment in order to improve the adhesion to the adjacent layer. As the surface treatment, it is possible to apply known resin surface modification techniques such as corona discharge treatment, flame treatment, ozone treatment, ultraviolet treatment, radiation treatment, surface roughening treatment, chemical treatment, plasma treatment, grafting treatment and the like. The above-mentioned surface treatment may be carried out only one kind or two or more kinds. Further, if necessary, an undercoat layer (primer layer) may be provided on one side or both sides of the substrate 50.

(Dye Layer)

The dye layer 55 contains a sublimable dye and a binder resin as essential components. As the sublimable dye, for example, diarylmethane type dyes; triarylmethane type dyes; thiazole type dyes; merocyanine dyes; pyrazolone dyes; methine type dyes; indoaniline type dyes; azomethine type dyes such as acetophenone azomethine, pyrazoloazomethine, imidazole azomethine, imidazo azomethine, pyridone azomethine, etc.; xanthene type dyes; oxazine type dyes; cyanostyrene type dyes such as dicyanostyrene and tricyanostyrene, etc.; thiazine type dyes; azine type dyes; acridine type dyes; benzeneazo type dyes; azo type dyes such as pyridoneazo, thiopheneazo, isothiazole azo, pyrrozole azo, pyrazole azo, imidazole azo, thiadiazole azo, triazole azo, disazo, etc.; spiropyran type dyes; indolino spiropyran type dyes; fluoran type dyes; rhodamine lactam type dyes; naphthoquinone type dyes; anthraquinone type dyes; quinophthalone type dyes; and the like may be enumerated. More specifically, compounds exemplified in JP Hei 7-149062 A and the like can be mentioned. The sublimable dye is preferably in the range of not less than 5% by mass and not more than 90% by mass, more preferably in the range of not less than 10% by mass and not more than 70% by mass, based on the total solid content of the dye layer. When the content of the sublimation dye is within the above range, it is possible to improve the print density and preservability.

As the binder resin for supporting the above mentioned dye, for instance, cellulose type resins such as ethyl cellulose resin, hydroxyethyl cellulose resin, ethyl hydroxy cellulose resin, methyl cellulose resin, nitrocellulose resin, cellulose acetate resin, etc.; vinylic resins such as polyvinyl alcohol resin, polyvinyl acetate resin, polyvinyl butyral resin, polyvinyl acetal resin and polyvinyl pyrrolidone, etc.; acrylic resins such as poly(meth)acrylate and poly(meth) acrylamide, etc.; polyurethane type resins, polyamide type resins, polyester type resins, phenoxy resins, phenol resins, epoxy resins and the like may be enumerated. Among them, resins such as cellulose type, vinyl type, acrylic type, polyurethane type, polyester type and the like are preferable from the viewpoints of heat resistance, migration of dyes and the like.

The dye layer 55 may contain a releasing agent, inorganic fine particles, organic fine particles and the like. Examples of the releasing agent include silicone oil, polyethylene wax, phosphate ester and the like. Examples of silicone oils include straight silicone oils, modified silicone oils and cured products thereof. The silicone oil may be reactive or nonreactive. Examples of the inorganic fine particles include carbon black, aluminum, molybdenum disulfide, and the like. The modified silicone oil can be classified into a reactive silicone oil and a nonreactive silicone oil. Examples of reactive silicone oils include amino-modified, epoxy-modified, carboxyl-modified, hydroxy-modified, methacrylic-modified, mercapto-modified, phenol-modified, single-terminal reactive/heterogeneous functional group-modified. Examples of nonreactive silicone oils include polyether modified, methyl styryl modified, alkyl modified, higher fatty acid ester modified, hydrophilic special modified, higher alkoxy modified, fluorine modified and the like. The addition amount of the silicone oil is preferably in the range of not less than 0.1% by mass and not more than 15% by mass, more preferably in the range of not less than 0.3% by mass and not more than 10% by mass, based on the mass of the binder. Examples of the organic fine particles include polyethylene wax and the like.

The dye layer 55 can be formed, for example, by preparing a dye layer coating liquid where a sublimable dye, a binder resin, and various components added arbitrarily as necessary are dispersed or dissolved in an appropriate solvent, coating the dye layer coating liquid onto a substrate in accordance with a conventionally known coating method, and drying the coated coating liquid. As the conventionally known coating methods, a gravure printing method, a reverse roll coating method using a gravure plate, a roll coater, a bar coater, and the like may be enumerated. Examples of the solvent include toluene, methyl ethyl ketone, ethanol, isopropyl alcohol, cyclohexanone, dimethylformamide [DMF], and the like. The thickness of the dye layer is not particularly limited, and is usually in the range of not less than 0.2 μm and not more than 5 μm.

The thermal transfer sheet 60 in the embodiment shown in FIG. 2 has a structure in which a single dye layer 55 is provided on a substrate 50, but the thermal transfer sheet 60 may also has another structure in which a plurality of dye layers each having a different hue are provided on the same surface of the substrate 50 in a surface sequential manner.

(Backing Layer)

Further, on the other surface of the substrate, a backing layer for improving the heat resistance of the thermal transfer sheet and the running performance of the thermal head at the time of printing, and the like may be provided.

The backing layer can be formed by appropriately selecting conventionally known thermoplastic resin or the like. As such thermoplastic resins, for example, thermoplastic resins such as polyester type resins, polyacrylate type resins, polyvinyl acetate type resins, styrene acrylate type resins, polyurethane type resins, polyolefin resins such as polyethylene resins and polypropylene resins, polystyrene type resins, polyvinyl chloride type resins, polyether type resins, polyamide type resins, polyimide type resins, polyamide imide type resins, polycarbonate type resins, polyacrylamide resins, polyvinyl chloride resins, polyvinyl butyral resins, polyvinyl acetal resins such as polyvinyl acetoacetal resin; and silicon modified derivatives of these thermoplastic resins may be enumerated. Among them, from the viewpoint of heat resistance and the like, polyamide imide type resins and silicone-modified derivatives thereof and the like can be preferably used.

For the purpose of improving the slip property, it is preferable that the back layer further contains various additives including a releasing agent such as wax, higher fatty acid amide, phosphoric acid ester compound, metal soap, silicone oil, surfactant, etc.; organic powder such as fluorine resin; inorganic particles such as silica, clay, talc, calcium carbonate and the like, in addition to the thermoplastic resin described above, and it is particularly preferable that the back layer contains at least one kind of phosphate ester or metal soap.

The backing layer can be formed, for example, by applying a coating liquid where the above thermoplastic resin and various additives added as necessary is dispersed or dissolved in an appropriate solvent onto the substrate 50 in accordance with a conventionally known procedure such as a gravure printing method, a screen printing method, a reverse roll coating method using a gravure plate, or the like, and then drying the coated coating liquid. The thickness of the backing layer is preferably in the range of not more than 2 μm, more preferably not less than 0.1 μm and not more than 1 μm.

In place of the thermal transfer sheet 60 of the embodiment shown in FIG. 2, a thermal transfer sheet in which one or two or more dye layers and a protective layer are provided on the same surface of the substrate 50 in a surface sequential manner may be used.

(Formation of Thermal Transfer Image)

A method for forming a thermal transfer image on the decorative seal 10 is not particularly limited, and, for example, as shown in FIG. 3A, when the decorative seal 10 used in the image forming method of the embodiment described above and the thermal transfer sheet 60 are overlapped so that the film 3 of the decorative seal 10 faces the dye layer 55 of the thermal transfer sheet 60, then, the thermal energy corresponding to the image information is applied from the back side of the thermal transfer sheet by a heating means 70 such as a thermal head or the like, and thereby the sublimable dye contained in the dye layer 55 of the thermal transfer sheet 60 is allowed to be transferred onto the film 3 containing the resin having the dyeing affinity, it is possible to form a thermal transfer image 80 on the film 3 as shown in FIG. 3B. Further, the thermal transfer image 80 can be formed by using various conventionally known printers or the like.

In the image forming method of one embodiment, since the film 3 on which a thermal transfer image is formed contains a resin having a dyeing affinity and an elongation percentage of being in the range of not less than 150% and not more than 400% when determined by a test method in conformity with JIS-K-7127:1999, it is possible to suppress fading of the formed thermal transfer image. In addition, it is possible to improve the mounting property when the seal base material 5 including the film 3 on which the thermal transfer image has been formed is attached onto the transfer image-receiving article.

<Transfer Image-Receiving Article>

There is no limitation on the transfer image-receiving article to which the seal base material 5 including the film 3 on which the thermally transferred image has been formed is adhered. For example, as the transfer image-receiving article, the one that has a flat surface as the surface to which the seal base material 5 is affixed, such as a card, etc., may be used, while the other that has that has a surface having a curvature as the surface to which the seal base material 5 is affixed, such as a nail or other parts of human body, or a container, etc., may be also used. In particular, the decorative seal 10 provided with the seal base material 5 including the film 3 having the thermally transferred image 80 formed thereon by the image forming method of one embodiment can be suitably used for nail sticker or the like for decoration of nail, wherein the surface of nail to which the seal base material 5 is attached has discontinuous curvatures.

EXAMPLE

Next, the present invention will be described in more detail by way of examples.

As a release sheet, a polyethylene terephthalate film having a thickness of 100 μm was used, an adhesive layer having a thickness of 25 μm and a seal base material containing the film shown in the following Table 1 were provided in this order on the release sheet. By repeating this procedure, the decorative seals of Examples 1 to 10 and Comparative Examples 1 to 3 were prepared. The elongation percentage in the table is the elongation percentage determined by the test method in conformity with JIS-K-7127:1999.

TABLE 1

|  | Film | | |
| --- | --- | --- | --- |
|  | Material | Elongation percentage | Thickness |
| Example 1 | Polyvinyl chloride | 187% | 50 μm |

TABLE 1-continued

| | Film | | |
|---|---|---|---|
| | Material | Elongation percentage | Thickness |
| Example 2 | Polyvinyl chloride | 208% | 50 μm |
| Example 3 | Polyvinyl chloride | 225% | 50 μm |
| Example 4 | Polyvinyl chloride | 255% | 50 μm |
| Example 5 | Polyvinyl chloride | 150% | 50 μm |
| Example 6 | Polyvinyl chloride | 400% | 50 μm |
| Example 7 | Polyvinyl chloride | 225% | 20 μm |
| Example 8 | Polyvinyl chloride | 225% | 60 μm |
| Example 9 | Polyvinyl chloride | 225% | 100 μm |
| Example 10 | Polyvinyl chloride | 225% | 10 μm |
| Comparative Example 1 | Polyvinyl chloride | 130% | 50 μm |
| Comparative Example 2 | Polyvinyl chloride | 420% | 50 μm |
| Comparative Example 3 | Polyethylene terephthalate | <100% | 50 μm |

(Evaluation of Wearability)

Using each decorative seal of Examples and Comparative Examples, the seal base material peeled off from the release sheet was applied to a commercially available nail chip type 1 (width: 20 mm, length 25 mm) and a commercially available nail chip type 2 (width: 10 mm, length 16 mm), with a testing frequency of three times per a nail chip type, and the wearing property at this time was evaluated according to the following evaluation criteria. The evaluation results are shown in Table 2.

<Evaluation Criteria>

A: The seal base material was able to be affixed to all pieces of both nail chip types 1 and 2 without wrinkle.

B: In the nail chip type 1, minute crinkles which were no problem in visual appearance were generated, but no crinkle was generated in the nail chip type 2.

C: In both of the nail chip types 1 and 2, minute crinkles which were no problem in visual appearance were generated.

NG: Both nail chip types 1 and 2 had crinkles that were problematic in appearance.

(Dyeing Affinity Evaluation)

A black solid image (thermally transferred image) was formed on the film of the decorative seal of each Example and Comparative Example under the following printing conditions by combining the decorative seal of each Example and Comparative Example with the thermal transfer sheet prepared under the following conditions. The reflection density of the black solid image was measured with a spectrophotometer (Spectrolino, manufactured by Gretag Macbeth), and the dyeing affinity was evaluated according to the following evaluation criteria. The evaluation results are shown in Table 2.

(Preparation of Thermal Transfer Sheet)

A polyethylene terephthalate film having a thickness of 5 μm was used as a substrate, and a backing layer coating solution having the above composition was coated thereon so as to obtain a dried thickness of 1.0 g/m² to form a backing layer. Next, a primer layer coating solution having the following composition was applied to the other side of the substrate so as to obtain a dried thickness of 0.15 g/m² to form a dye primer layer. On the dye primer layer, coating solutions for the yellow, magenta and cyan dye layers having the following compositions were applied in a surface sequential manner so as to obtain each dried thickness of 0.7 g/m² to form a yellow dye layer, a magenta dye layer, and a cyan dye layer, and thus a thermal transfer sheet was obtained.

| <Coating Solution for Dye Primer Layer> | |
|---|---|
| Water-based urethane resin (solid content 26%) (Tg: −17° C.) (Superflex 650, manufactured by Daiichi Kogyo Seiyaku Co., Ltd.) | 5 parts |
| Water | 47.5 parts |
| Isopropyl alcohol | 47.5 parts |
| <Coating Solution for Yellow Dye Layer> | |
| Solvent Yellow 93 | 5 parts |
| Polyvinyl acetoacetal resin (KS-5, manufactured by Sekisui Chemical Co., Ltd.) | 4 parts |
| Toluene | 50 parts |
| Methyl ethyl ketone | 50 parts |
| <Coating Solution for Magenta Dye Layer> | |
| Disperse red 60 | 3 parts |
| Disperse Violet 26 | 3 copies |
| Polyvinyl acetoacetal resin (KS-5, manufactured by Sekisui Chemical Co., Ltd.) | 5 parts |
| Toluene | 50 parts |
| Methyl ethyl ketone | 50 parts |
| <Coating Solution for Cyan Dye Layer> | |
| Solvent Blue 63 | 3 parts |
| Disperse Blue 354 | 2.5 parts |
| Polyvinyl acetoacetal resin (KS-5, manufactured by Sekisui Chemical Co., Ltd.) | 5 parts |
| Toluene | 50 parts |
| Methyl ethyl ketone | 50 parts |

(Printing Conditions)

Thermal head: F3598 (Toshiba Hokuto Electronics Co., Ltd.)

Heating element average resistance value: 5176 (Ω)

Printing density in the main scanning direction: 300 (dpi)

Printing density in the sub scanning direction: 300 (dpi)

Printing power: 0.12 (W/dot)

One line cycle: 2 (msec.)

Pulse Duty: 85(%)

Printing start temperature: 35.5 (° C.)

<Evaluation Criteria>

A: The reflection density of the black solid image was not less than 1.5.

B: The reflection density of the black solid image was not less than 0.5 and less than 1.5.

NG: The reflection density of the black solid image was less than 0.5.

(Evaluation of Preservability)

In the evaluation of the above dyeing affinity, the decorative seal on which the black solid image was formed on the film was stored at 37° C. in a dry environment for 48 hours, and the density remaining ratio of the black solid image was calculated from the data of the reflection densities before and after storage. And the preservability of black solid images was evaluated according to the following evaluation criteria. The evaluation results are shown in Table 2. The reflection density was measured by a spectrophotometer (Spectrolino, manufactured by Gretag Macbeth).

<Evaluation Criteria>
A: The density remaining ratio of the black solid image was not less than 95%.
B: The density remaining ratio of the black solid image was not less than 90% and less than 95%.
NG: The density remaining ratio of the black solid image was less than 90%.

TABLE 2

|  | Wearability | Dyeing affinity | Preservability |
|---|---|---|---|
| Example 1 | B | A | A |
| Example 2 | A | A | A |
| Example 3 | A | A | A |
| Example 4 | A | A | A |
| Example 5 | B | A | A |
| Example 6 | B | A | B |
| Example 7 | A | A | A |
| Example 8 | B | A | A |
| Example 9 | C | A | B |
| Example 10 | C | A | A |
| Comparative Example 1 | NG | A | A |
| Comparative Example 2 | A | A | NG |
| Comparative Example 3 | NG | NG | NG |

EXPLANATION OF NUMERALS

10 Decorative seal
1 Release sheet
2 Adhesive layer
3 Film
5 Seal base material It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications are covered by the appended claims. The content of all references referred to herein are incorporated herein by reference in their entirety.

The invention claimed is:

1. An image forming method, comprising steps of:
   preparing a thermal transfer sheet comprising a dye layer formed on a substrate, the dye layer containing sublimable dye;
   preparing a decorative seal comprising a seal base material releasably provided on a release sheet, the seal base material having a layered structure comprising an adhesive layer and a film layered in this order from the release sheet side, the film containing a resin having a dyeing affinity to the sublimable dye contained in the dye layer, and the film having an elongation percentage in a range of not less than 150% and not more than 400% when determined by a test method in conformity with JIS-K-7127:1999; and
   thermally transferring the sublimable dye in the dye layer of the thermal transfer sheet onto the seal base material of the decorative seal by a sublimation type thermal transfer process, thereby forming a thermal transfer image on the seal base material.

2. The image forming method according to claim 1, wherein the film contains a vinyl chloride resin as the resin having the dyeing affinity to the sublimable dye.

3. The image forming method according to claim 1, wherein the film has a thickness of being in the range of not less than 20 μm and not more than 60 μm.

* * * * *